(12) United States Patent
Jeong et al.

(10) Patent No.: US 9,233,487 B2
(45) Date of Patent: Jan. 12, 2016

(54) METHOD FOR MANUFACTURING PHOTOALIGNING INTEGRATED LARGE AREA METALLIC STAMP, AND METHOD FOR MANUFACTURING POLYMER OPTICAL DEVICE USING SAME

(75) Inventors: Myung Yung Jeong, Busan (KR); Seung Hun Oh, Busan (KR); Jin Hwa Ryu, Ulsan (KR); Sang Uk Cho, Gyeongsangnam-Do (KR); Tae Ho Lee, Busan (KR)

(73) Assignee: Pusan National University Industry-University Cooperation Foundation, Pusan (KR)

( * ) Notice: Subject to any disclaimer, the term of this patent is extended or adjusted under 35 U.S.C. 154(b) by 244 days.

(21) Appl. No.: 13/980,188

(22) PCT Filed: Feb. 22, 2011

(86) PCT No.: PCT/KR2011/001151
§ 371 (c)(1),
(2), (4) Date: Jul. 17, 2013

(87) PCT Pub. No.: WO2012/099294
PCT Pub. Date: Jul. 26, 2012

(65) Prior Publication Data
US 2013/0292052 A1 Nov. 7, 2013

(30) Foreign Application Priority Data
Jan. 17, 2011 (KR) .................. 10-2011-0004672

(51) Int. Cl.
*B29C 33/38* (2006.01)
*B29D 11/00* (2006.01)
*G03F 7/00* (2006.01)
(Continued)

(52) U.S. Cl.
CPC ......... *B29C 33/3842* (2013.01); *B29C 33/3857* (2013.01); *B29D 11/0048* (2013.01); *B29D 11/0074* (2013.01); *B29D 11/00663* (2013.01); *B82Y 10/00* (2013.01); *B82Y 40/00* (2013.01); *C25D 1/00* (2013.01); *C25D 1/10* (2013.01); *G03F 7/0002* (2013.01)

(58) Field of Classification Search
None
See application file for complete search history.

(56) References Cited

U.S. PATENT DOCUMENTS 5,311,604 A * 5/1994 Rogner et al. .................. 385/14
6,517,995 B1 * 2/2003 Jacobson et al. .............. 430/320
(Continued)

FOREIGN PATENT DOCUMENTS

EP 1731962 A1 12/2006
KR 10-0988299 B1 * 10/2010 ............... G02B 6/10

OTHER PUBLICATIONS

International Search Report for PCT/KR2011/001151 mailed Feb. 21, 2012 from ISA/KR.

*Primary Examiner* — Anita Alanko
(74) *Attorney, Agent, or Firm* — Paratus Law Group, PLLC

(57) ABSTRACT

The disclosure relates to a method for manufacturing a photoaligning integrated large area metallic stamp, which includes the following steps: making a unit device PLC mold pattern, and molding a unit PLC device pattern through a multistep imprinting method using the PLC mold pattern; heat treating the unit PLC device pattern to minimize scattering loss due to surface roughness; making a groove pattern for supporting an optical fiber; making an integrated PDMS mold for a unit device by aligning the unit PLC device pattern and the groove pattern; and repeatedly replicating the integrated PDMS mold for a unit device to make a large area PDMS pattern, and making a large area stamp through electroforming using the large area PDMS pattern.

12 Claims, 14 Drawing Sheets

(51) Int. Cl.
*G02B 6/10* (2006.01)
*C25D 1/00* (2006.01)
*C25D 1/10* (2006.01)
*B82Y 10/00* (2011.01)
*B82Y 40/00* (2011.01)

(56) References Cited

U.S. PATENT DOCUMENTS

2005/0120902 A1 6/2005 Adams et al.
2007/0261574 A1 11/2007 Kendale et al.

\* cited by examiner

METHOD FOR MANUFACTURING PHOTOALIGNING INTEGRATED LARGE AREA METALLIC STAMP, AND METHOD FOR MANUFACTURING POLYMER OPTICAL DEVICE USING SAME

CROSS REFERENCE TO PRIOR APPLICATION

This application is a National Stage Patent Application of PCT International Patent Application No. PCT/KR2011/001151 (filed on Feb. 22, 2011) under 35 U.S.C. §371, which claims priority to Korean Patent Application No. 10-2011-0004672(filed on Jan. 17, 2011), which are all hereby incorporated by reference in their entirety.

TECHNICAL FIELD

The present invention relates to a polymer optical device, and more particularly, to a method for manufacturing a photoaligning integrated large area metallic stamp which has high efficiency in large area by preparing a large area stamp in which a groove pattern for supporting an optical fiber and a planar lightwave circuit (PLC) pattern are integrated, and a method for manufacturing a polymer optical device using the same.

BACKGROUND ART

The application of optical communication technologies is extended to meet the needs of the amount of information transmission capacity with an explosive increase in the use of the Internet, etc. The development of optical communication techniques promotes introduction of fiber to home (FTTH), and accordingly, the low cost of a planar lightwave circuit (PLC) device becomes an important element of competitiveness.

Most conventional PLC devices are manufactured as silica-based PLC devices, but have many problems in terms of cost due to a high-temperature process and a complicated production process. In order to solve such problems, studies have been conducted to manufacture a polymer PLC device applicable to a low-temperature (<300° C.) process and a low-cost and mass-production process.

In a roll and plate (R&P) imprint process, a fine pattern is directly transferred by allowing a stamp with a fine structure to be physically contacted with a polymer layer. Hence, the R&P imprint process is simple, and thus mass-production is possible at low cost. Accordingly, the R&P imprint process has come into the spotlight as the most suitable process technique in manufacturing the polymer PLC device.

In the polymer PLC device manufactured by such a technique, an optical waveguide medium is formed inside the PLC device so that light passes through the optical waveguide. Therefore, an optical path as the optical waveguide medium should be very precisely formed to maintain the efficiency and performance of the polymer PLC device.

Accordingly, it is very important to develop a technique for manufacturing a large area stamp of a PLC device for an imprint process and a large area molding technique.

A conventional stamp of a PLC device is manufactured as a wafer-based stamp through photolithography and etching processes. In the technique for manufacturing the stamp through these processes, it is impossible to implement a branch pattern of 1 µm or less, and it is difficult to maintain uniform dimensional accuracy on the entire wafer. Therefore, it is difficult to implement a high-efficiency PLC device.

In order to solve such a problem, a high-precision stamp should be manufactured through electron beam exposure with high resolution. However, in manufacturing the stamp with a wafer size through the electron beam exposure, manufacturing cost is considerably increased, and it takes much time to perform the electron beam exposure.

Accordingly, there have been proposed methods for manufacturing a high-precision, large area stamp through an exposure technique and an imprint technique using a step & repeat method. However, the method for manufacturing the stamp using the step & repeat method requires equipment in which a precise stage system is built. Since a pattern is formed by the step & repeat method, it is difficult to equally maintain residual layers between unit patterns.

In addition, the size of the large area stamp is limited by an exposure system and imprint equipment using the step & repeat method.

If the stamp is manufactured through such processes, patterns are formed in the same shape.

The pattern formation of a polymer PLC device is performed by forming an under-clad channel through which light is waveguided by a thermal imprint method, using an embossing stamp, filling a core material in the under-clad channel, covering the core material with an upper-clad and then curing the core material through UV irradiation.

However, a gap portion of a micron or less exists in the pattern of the PLC device. When the pattern of the PLC device is manufactured by the thermal imprint method, the pattern of the PLC device may be broken or deformed due to sticking in a demolding process.

In a case where the core material is pressed while being covered with the upper-clad so as to manufacture the PLC device, the slab thickness is not only a factor for determining leakage of light but also a factor for maintaining adhesion between clad layers. Thus, it is very important to control the slab thickness.

In addition, it is very important to perform a refractive index control in the high-efficiency polymer PLC device. However, it is difficult to perform a precise refractive index control, using the curing method of the core material in the state in which the core material is covered with the upper-clad after the under-clad channel is formed.

DISCLOSURE OF INVENTION

Technical Problem

Accordingly, the present invention is conceived to solve the aforementioned problems. An object of the present invention is to provide a method for manufacturing a photoaligning integrated large area metallic stamp and a method for manufacturing a polymer optical device using the same, which can have high efficiency in large area by manufacturing a large area stamp in which a groove pattern for supporting an optical fiber and a planar lightwave circuit (PLC) pattern are integrated.

Another object of the present invention is to provide a technique for manufacturing a large area stamp in which a groove pattern for supporting an optical fiber and a PLC pattern are integrated and a technique for manufacturing a high-efficiency PLC device using the same, which can be implemented at a low cost in data transmission required in optical communication and can be applied to the development of a low-loss, large area polymer PLC device.

Still another object of the present invention is to provide a method for manufacturing a photoaligning integrated large area metallic stamp and a method for manufacturing a polymer optical device using the same, which can maintain a low cost of the PLC device through the improvement of the productivity of the PLC device and can minimize loss in light generated in the PLC device through manufacturing of an integrated pattern including a groove for automatic alignment with an optical fiber and improvement of surface roughness, thereby manufacturing a high-efficiency PLC device.

Still another object of the present invention is to provide a method for manufacturing a photoaligning integrated large area metallic stamp and a method for manufacturing a polymer optical device using the same, which solves a problem of reliability of the PLC device, caused by the separation of the PLC device from an optical fiber due to external impact such as vibration, so that it is possible to improve the economic efficiency and performance of the PLC device, thereby achieving commercialization and early implementation of optical communication.

Still another object of the present invention is to provide a method for manufacturing a photoaligning integrated large area metallic stamp and a method for manufacturing a polymer optical device using the same, in which different engraving shapes of the PLC device can be formed in one large area stamp, so that it is possible to provide PLC devices with various shapes through one imprint process.

Still another object of the present invention is to provide a method for manufacturing a photoaligning integrated large area metallic stamp and a method for manufacturing a polymer optical device using the same, which can manufacture a large area PLC device without pattern deformation and damage, and can control the refractive index and slab thickness.

The objects of the present invention are not limited to the aforementioned objects, and other objects thereof will be understood by those skilled in the art from the following descriptions.

Technical Solution

According to an aspect of the present invention, there is provided a method for manufacturing a photoaligning integrated large area metallic stamp for manufacturing a polymer optical device, the method comprising: forming a unit device planar lightwave circuit (PLC) mold pattern and molding a unit PLC device pattern through a multistep imprinting process using the PLC mold pattern; heat treating the unit PLC device pattern to minimize scattering loss due to surface roughness; forming a groove pattern for supporting an optical fiber; making an integrated polydimethylsiloxane (PDMS) mold for a unit device by aligning the unit PLC device pattern and the groove pattern; and repetitively replicating the integrated PDMS mold for a unit device to form a large area PDMS pattern, and making a large area stamp through electroforming using the large area PDMS pattern.

The large area stamp may be implemented in a state in which the PLC device pattern and the groove pattern for supporting the optical fiber are integrated.

The step of forming the unit PLC device pattern may comprise forming a unit device PLC mold pattern by forming a unit device engraving PLC device pattern on a silicon substrate through electron beam lithography and an etching process; and forming the unit PLC device pattern by transferring an embossing pattern on a PMMA sheet of thermoplastic resin through a multistep imprint process based on guide pins for V groove alignment included in the silicon substrate having the unit device PLC mold pattern formed therein.

The silicon substrate having the unit device PLC mold pattern formed therein may have the guide pins for V groove alignment, positioned at ends of input and output stages. The silicon substrate may include a guide key pattern for basic alignment of the large area stamp of a post-process, a key pattern for precise dicing of unit devices manufactured through the large area stamp, and guide key patterns for alignment of the PLC device and the V groove.

After a polymer used as an under-clad is heated at a temperature greater than a glass transition temperature (Tg), a holing pressure greater than an initial pressure may be applied to the polymer after the initial pressure, and the initial pressure may be again applied to the polymer, in order to prevent damage of the mold and to reduce stress remaining in the polymer.

The step of heat treating the unit PLC device pattern to minimize scattering loss due to surface roughness may be performed to remove a scallop shape produced in the etching process by performing a heat treatment process on the material for forming the unit PLC device pattern at the glass transition temperature or less (sub-Tg).

The step of forming the groove pattern may comprise coating a silicon substrate with imprint resin to have a thickness smaller than the height of the pattern to form a resist; imprinting a quadrangular pattern at a time using a stamp for a unit device, the quadrangular pattern having the same line width as the PLC device pattern and the groove pattern; forming a quadrangular pattern for forming the imprinted groove into a V groove pattern through anisotropic wet etching or into a quadrangular pattern through a reactive ion etching (RIE) technique; forming an embossing pattern through UV imprint using a UV resist and a PMMA sheet to make an engraving PDMS mold; and leaving only the groove pattern in the formed embossing pattern using the key pattern for dicing.

The groove pattern may be disposed on the same line as the input/output stage of the PLC device to reduce an alignment error.

The step of making the integrated PDMS mold for the unit device may comprise performing 45 degree polishing to facilitate the alignment of the diced PLC device pattern and the groove pattern; and integrally aligning the PLC device pattern and the groove pattern, and making an engraving PDMS mold having the PLC device pattern and the groove pattern integrated through a replica molding process.

In the replica molding process, bubbles may be removed under a vacuum atmosphere, and a PDMS pattern having a PLC pattern engraved therein may be formed by removing even entrapped voids using ultrasonic vibration energy and then curing the pattern at a temperature of 60° C. for about 3 hours.

The step of forming the large area PDMS pattern may comprise replicating a unit device PDMS PLC pattern as large as a desired large area stamp and then cutting the replicated PDMS patterns using the guide key pattern; and placing the PDMS patterns having different heights on a glass plate or substrate having the same size as the large area stamp, pouring liquid PDMS in the PDMS patterns, and thermal curing the PDMS under the same curing condition as unit device curing.

The step of manufacturing the large area stamp may comprise depositing a base layer on the large area PDMS pattern; and forming a large area nickel mold through nickel electrolysis plating. A deposition temperature and a deposition rate of the base layer may be controlled to prevent cracks and exfoliation from the substrate due to thermal expansion caused by a difference in surface temperature between metals deposited in the deposition of the base layer.

In the control of the deposition temperature and the deposition rate, the base layer may be deposited at a temperature of 90±10° C. at a deposition rate of 0.8±0.2 Å/sec to prevent the cracks.

According to another aspect of the present invention, there is provided a method for manufacturing a polymer optical device using a photoaligning integrated large area metallic stamp in a roll and plate (R&P) imprint process, the large area metallic stamp having a PLC device pattern and a groove pattern for supporting an optical fiber integrated, the method comprising: dropping UV curable resin in a pico-level amount on the large area stamp at a regular interval, the UV curable resin being used as a clad material of a PLC device; increasing flowability through a decrease in viscosity of the UV curable resin by increasing temperature of a substrate having a heating coil built therein; adjusting height of a primary roller and then planarizing and filling the resin; precisely filling the resin in the pattern of a channel by inducing squeeze flow through a secondary roller for pressing; and molding the filled UV curable resin through both soft exposure and hard exposure.

The soft exposure may be performed for a first reference time, and the hard exposure for complete curing after demolding may be performed under a nitrogen atmosphere for a second reference time longer than the first reference time, to reduce a defect of the pattern due to interlocking on an interface.

According to still another aspect of the present invention, there is provided a method for manufacturing a polymer optical device using a photoaligning integrated large area metallic stamp having a PLC device pattern and a groove pattern for supporting an optical fiber integrated, the method comprising: dropping a core material on the formed PLC device pattern at a regular interval to fill a core in an under-clad pattern; primarily adjusting the thickness of the core material by pressing a sheet made of an upper-clad material through a roller while increasing flowability of the core material; secondarily adjusting the thickness of the core material by repeating the process of pressing the upper-clad material through the roller; attaching upper-clad and lower-clad by curing the core material through UV exposure so that the refractive index of the core material is primarily controlled; and secondarily controlling the refractive index of the core material through a heat treatment process.

Advantageous Effects

The method for manufacturing the photoaligning integrated large area metallic stamp, and a method for manufacturing the polymer optical device using the same according to the present invention have effects as follows.

First, it is possible to manufacture a large area PLC device without pattern deformation and damage and to control the refractive index and slab thickness through the UV R&P imprint technique using the large area nickel stamp.

Second, it is possible to mass-produce the PLC device at a low cost through the UV R&P imprint technique using the large area nickel stamp.

Third, the groove pattern for supporting the optical fiber and the PLC pattern are integrated through the imprint technique, so that it is possible to automatically align the optical connection between the PLC device and the optical fiber, thereby improving the coupling efficiency of light.

Fourth, the groove pattern for supporting the optical fiber and the PLC pattern are integrated, so that it is possible to prevent separation between the optical fiber and the PLC device due to external impact such as vibration, thereby securing reliability.

Fifth, it is possible to simply manufacture a stamp for PLC devices with various shapes and thicknesses and to manufacture various PLC devices through one process, using the stamp.

Sixth, it is possible to manufacture a high-efficiency PLC device which can minimize loss in light by improving surface roughness through heat treatment, performing large area patterning through repetitive UV exposure (two UV exposure processes) and controlling the refractive index.

BEST MODE

Hereinafter, a method for manufacturing a photoaligning integrated large area metallic stamp and a method for manufacturing a polymer optical device using the same according to a preferred embodiment of the present invention will be described as follows.

Features and advantages of the method for manufacturing the photoaligning integrated large area metallic stamp and the method for manufacturing the polymer optical device using the same according to the present invention will be apparent through the following detailed descriptions of embodiments.

Figure 1:
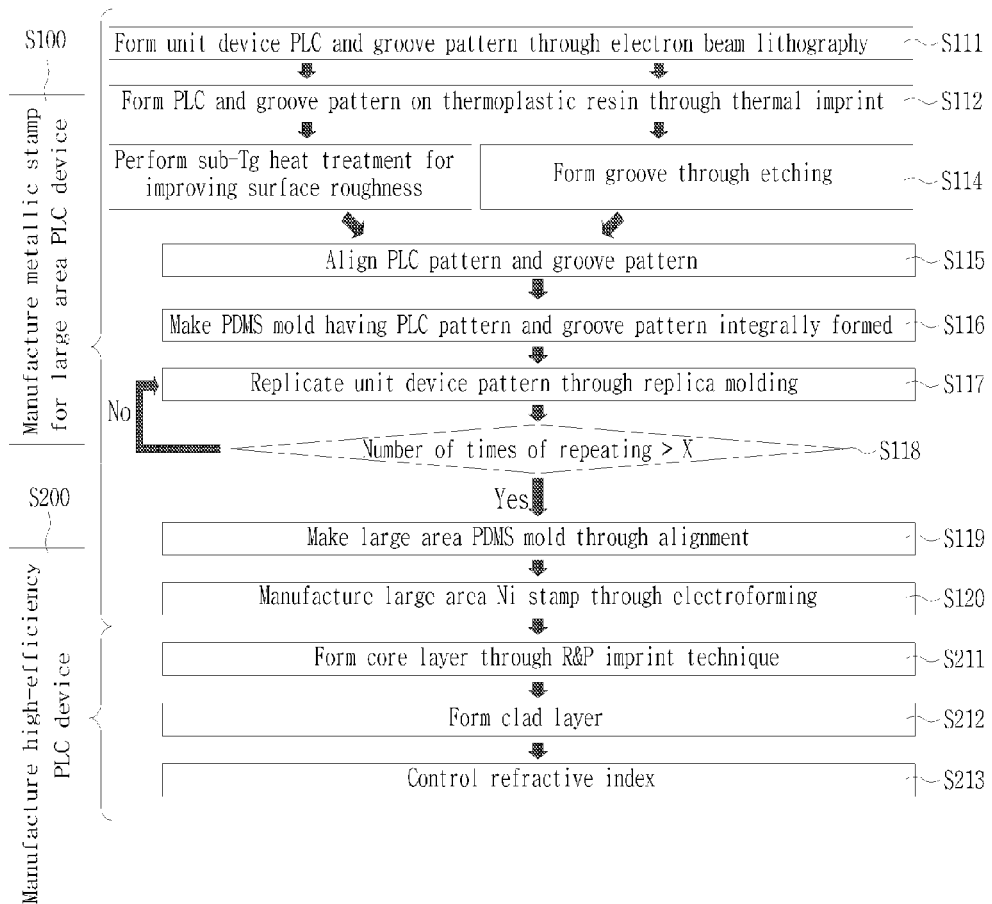
FIG. 1 is a flowchart illustrating a method for manufacturing a large area metallic stamp for manufacturing a planar lightwave circuit (PLC) device and a method for manufacturing a high-efficiency polymer PLC device using the same according to an embodiment of the present invention.

FIG. 1 is a flowchart illustrating a method for manufacturing a large area metallic stamp for manufacturing a planar lightwave circuit (PLC) device and a method for manufacturing a high-efficiency polymer PLC device using the same according to an embodiment of the present invention.

The method for manufacturing the polymer PLC device, which is currently studied, is performed through processes including a photolithography process, a reactive ion etching (RIE) process, a laser ablation process, an imprint process, etc. In the imprint process, a fine pattern is directly transferred by allowing a stamp with a fine structure to be physically contacted with a polymer layer. Hence, the imprint process is simple, and thus mass-production is possible at low cost. Accordingly, the imprint process has come into the spotlight as a suitable process technique in manufacturing the polymer PLC device.

The following conditions are required to manufacture a high-efficiency polymer PLC device through the imprint process.

First, a technique for manufacturing stamp for improving accuracy between shape and dimension designed to maintain high-efficiency performance and an imprint process technique;

Second, a technique for manufacturing large area stamp with excellent durability for improving productivity and an imprint process technique using the same;

Third, a technique for controlling entrapped voids at interface portion and alignment with optical fiber;

Fourth, a problem of reliability including the separation of PLC device from optical fiber due to external impact such as vibration;

Fifth, a technique for controlling scattering loss caused by surface roughness; and Sixth, a technique for slab thickness control and a technique for refractive index control.

The present invention relates to a method for manufacturing a stamp and a method for manufacturing a polymer PLC device using the same, which satisfies these required conditions.

That is, the present invention relates to a method for manufacturing a large area, high-precision photoaligning integrated nickel (Ni) stamp for a PLC, which is suitable for mass production, and a method for manufacturing a polymer PLC device using the same.

In the large area Ni stamp, a PLC pattern and a groove pattern for supporting optical fiber are integrated, and thus the pattern formed after imprint induces the automatic alignment between the optical fiber and the PLC device, thereby controlling entrapped voids at an interface portion.

Further, it is possible to solve the problem of reliability, caused by the separation of the PLC device from the optical fiber due to external impact such as vibration of the PLC device, which currently becomes the most serious problem.

In addition, there is provided a stamp having surface roughness controlled to be 10 nm or less through a heat treating technique of imprinted thermoplastic resin, thereby controlling scattering loss in the PLC device.

Hereinafter, the method for manufacturing the stamp and the method for manufacturing the polymer PLC device using the same, which requires these required conditions, will be described in detail.

The technique included in the present invention is generally configured with a technique for manufacturing a large area stamp in which a groove pattern for supporting an optical fiber and a PLC pattern are integrated for the purpose of automatic alignment with the optical fiber and a technique for manufacturing a high-efficiency PLC device using the same.

First, the technique for manufacturing the large area stamp, in which the groove pattern for supporting the optical fiber and the PLC pattern are integrated, includes a technique for forming a single PLC device pattern, forming a groove pattern, a technique for improving surface roughness through removal of a scallop shape caused by sub-Tg annealing, a technique for forming a large polydimethylsiloxane (PDMS) pattern through replication and alignment of unit devices, a technique manufacturing a Ni stamp for a large area PLC device through electroforming, etc.

The technique for manufacturing the high-efficiency PLC device includes a technique for forming an under-clad/core pattern through a roll and plate (R&P) imprint using the large area stamp, a lamination technique for slab thickness control, a technique for refractive index control, etc.

Accordingly, using these techniques, it is possible to manufacture a high-efficiency PLC device with excellent productivity at a low cost, to reduce coupling loss in light in the PLC device and to increase light output.

First, a method of manufacturing a metallic stamp for a large area PLC device (S100) is as follows.

As shown in FIG. 1, the method includes forming a unit device PLC pattern and a groove pattern through electron beam lithography (S111), forming PLC and groove patterns on thermoplastic resin through thermal imprint (S112), performing sub-Tg heat treatment for minimizing scattering loss caused by surface roughness (S113), forming a groove through etching (S114), aligning the PLC pattern and the groove (S115), making a unit device polydimethylsiloxane (PDMS) mold in which the PLC pattern and the groove pattern are integrated (S116), replicating a unit device pattern through replica molding (S117) by repeating the replication a predetermined times (S118), making a large area Ni PDMS mold through alignment (S119), and manufacturing a large area Ni stamp through electroforming (S120).

In addition, a method for manufacturing a high-efficiency PLC device (S200) includes forming a core layer through an R&P imprint technique using the large area stamp (S211), forming an under-clad through UV R&P imprint (S212) and controlling the refractive index of the PLC device (S213).

The photoaligning integrated large area metallic stamp, the method for manufacturing the same and the method for manufacturing the polymer optical device using the same according to the present invention may be implemented in several different forms. However, the present invention is not limited to a beam splitter device that is an embodiment described herein, and may be applied to all cases of the PLC device.

The method for manufacturing the large area stamp according to the embodiment of the present invention will be described in detail as follows.

Figure 2:
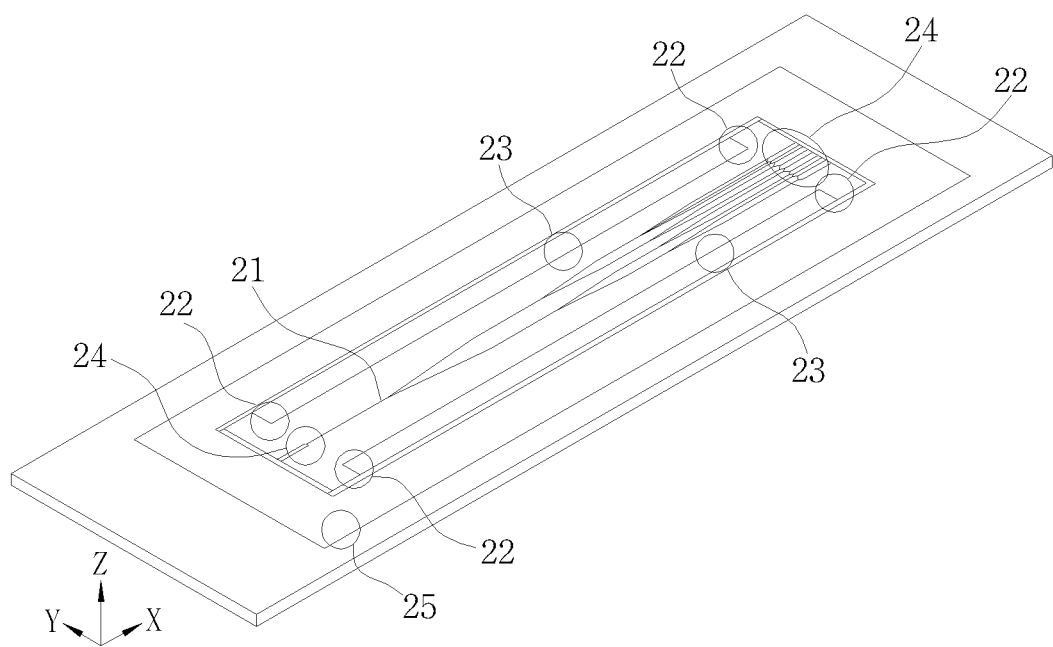
FIGS. 2 and 3 are configuration views illustrating a method for manufacturing a small area PLC unit device stamp and a method for forming a unit polymer PLC pattern through multistep imprint process.
Figure 3:
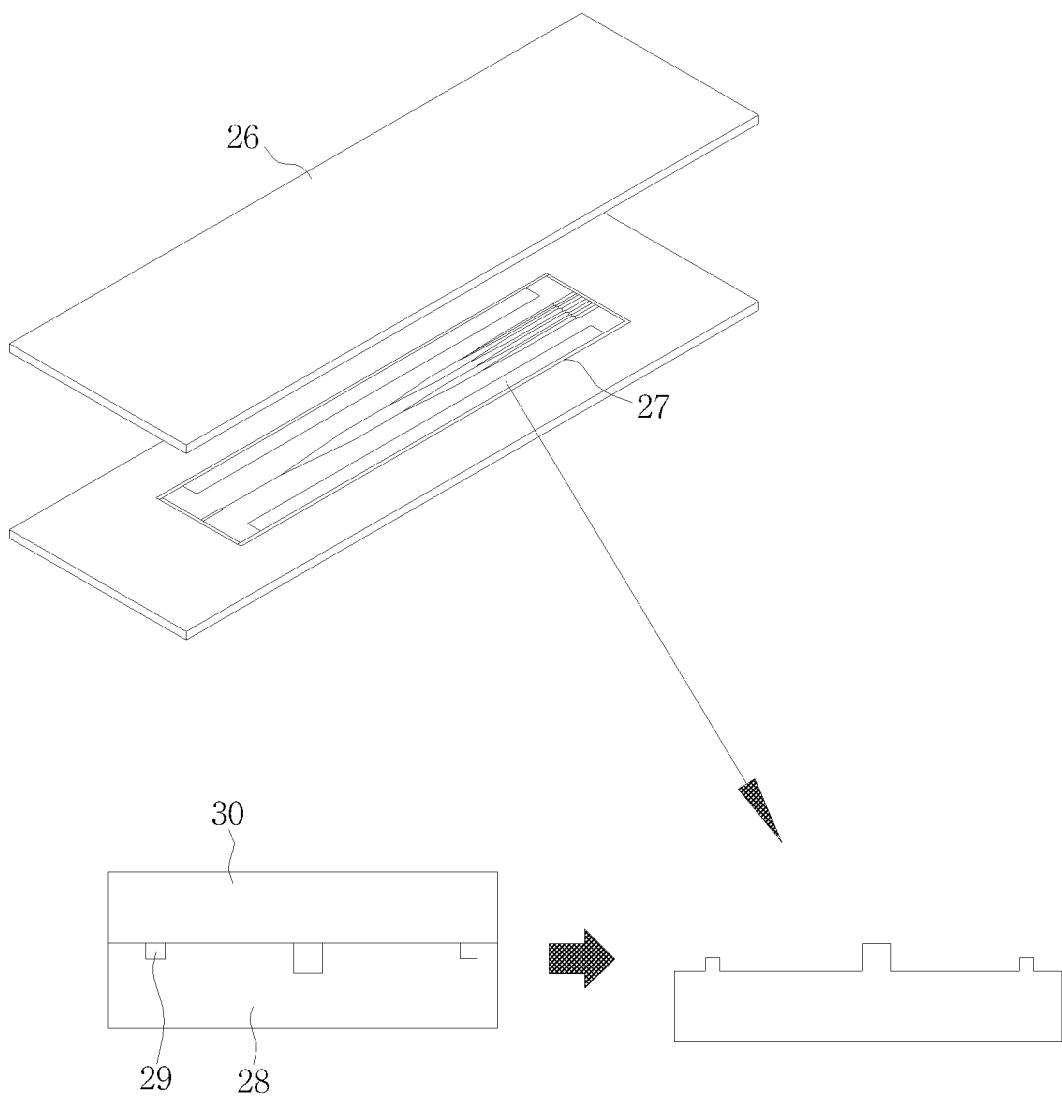

FIGS. 2 and 3 are configuration views illustrating a method for manufacturing a small area PLC unit device stamp and a method for forming a unit polymer PLC pattern through multistep imprint process.

As shown in FIG. 2, a unit device engraving PLC device pattern 21 is prepared on a silicon substrate through electron beam lithography and an etching process. The stamp formed through the electron beam lithography is a unit device small area stamp which has a small contact area and is a precisely manufactured.

In the manufactured stamp, quadrangular patterns 24 for forming a V groove for molding a groove pattern are placed at ends of input and output stages, in addition to the basic PLC device pattern 21.

The silicon substrate includes a guide key pattern 25 for basic alignment of the large area stamp, key patterns 22 for precisely dicing unit devices manufactured through the large area stamp, and guide key patterns 23 for alignment of the PLC device and the V groove.

As shown in FIG. 3, an embossing pattern is very precisely transferred onto a PMMA sheet 30 as thermoplastic resin through a multistep imprint technique, based on a guide pin 29 for aligning the V groove, using the manufactured small area stamp 28.

In FIG. 3, reference numeral 26 represents a small area PLC unit device silicon stamp, and reference numeral 27 represents an imprinted thermoplastic PLC pattern.

Thermal imprint is normally performed through a one-time pressing process. However, in the multistep imprint of the present invention, after a polymer used as an under-clad is heated at a temperature of Tg+30° C., a holing pressure of 35bar is applied to the polymer after an initial pressure of 25bar, and the pressure of the polymer is again lowered to the pressure of 25bar, so that it is possible to prevent damage of a mold and to reduce stress remaining in the polymer. Accordingly, it is possible to prevent a change in dimension, thereby increasing dimensional accuracy.

The unit device PLC PMMA pattern imprinted using the small area stamp has a deep surface roughness such as a scallop shape, caused by etching in the process of manufacturing the small area stamp.

The surface roughness causes not only scattering loss in the PLC device but also a sticking problem in release after the pattern is formed through the imprint and R&P technique.

In the present invention, the surface roughness can be improved through thermal treatment (PMMA: 90° C./60 min) at a glass transition temperature or less.

In the thermoplastic resin such as PMMA engraved with a pattern through the imprint technique, the long-range molecular movement of a segment having carbon connected thereto occurs in the vicinity of sub-Tg, and molecules can locally diffused. Thus, the molecules can move from one position to another position.

Accordingly, the annealing in the vicinity of the sub-Tg enables the molecules to actively move by increasing temperature of the PMMA, so that the viscosity of the polymer is decreased. Since the force between the molecules is decreased due to an increased in activation energy, the surface tension of the polymer is decreased.

For this reason, it is possible to improve the sidewall roughness of a circular PMMA master through the annealing in the vicinity of the sub-Tg (90° C. in the PMMA).

A process of forming a groove pattern for supporting an optical fiber is as follows.

FIGS. 4 to 9 are sectional views illustrating a process of forming groove patterns for optical fiber support according to the present invention.

First, when the groove pattern is formed, it is important to align the groove pattern with the PLC device pattern.

Figure 4:
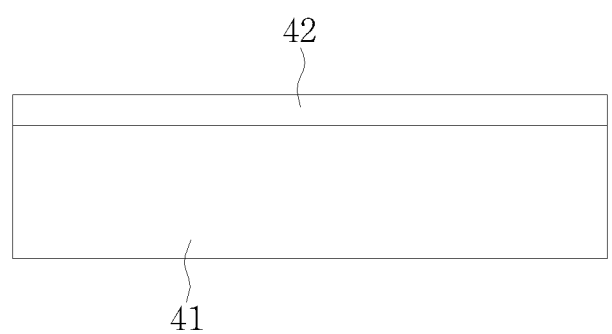
FIGS. 4 to 9 are sectional views illustrating a process of forming groove patterns for optical fiber support according to the present invention.
Figure 5:
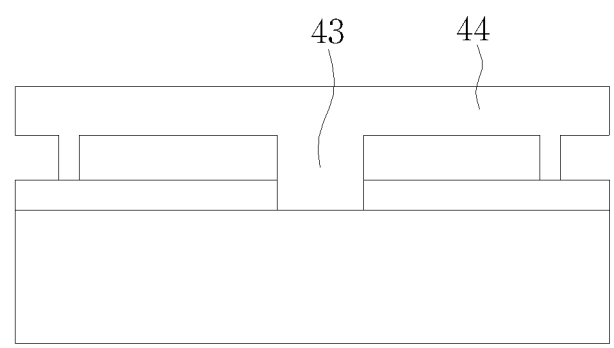

To this end, a silicon substrate 41 is coated with imprint resin to have a thickness smaller than the height of the pattern to form a resist 42 as shown in FIG. 4, and a PLC device pattern and a quadrangular pattern 43 having the same line width as a groove are imprinted at a time, using a stamp 44 for a unit device, as shown in FIG. 5.

Figure 6:
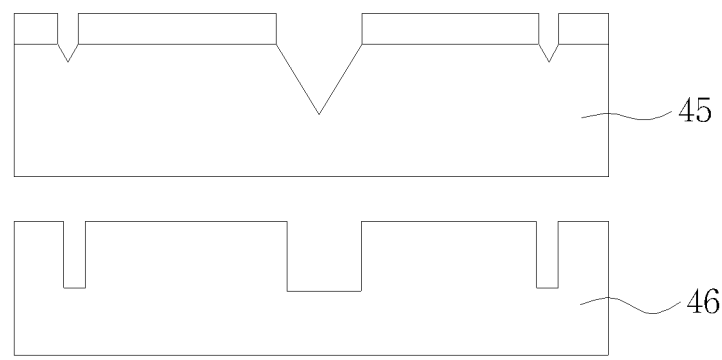

Subsequently, as shown in FIG. 6, the imprinted quadrangular pattern for forming the groove is formed into a V groove pattern through anisotropic wet etching, or is formed into a quadrangular pattern through an RIE technique.

Figure 7:
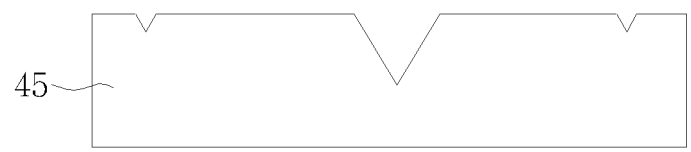
Figure 7:
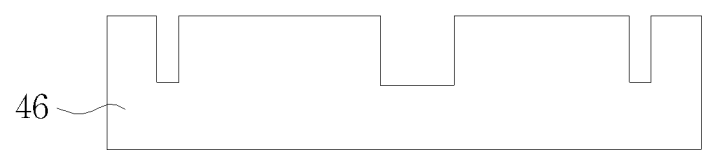

In FIG. 7, reference numeral 45 represents a substrate having the V groove pattern formed therein, and reference numeral 46 represents a substrate having the quadrangular pattern formed therein.

Figure 8:
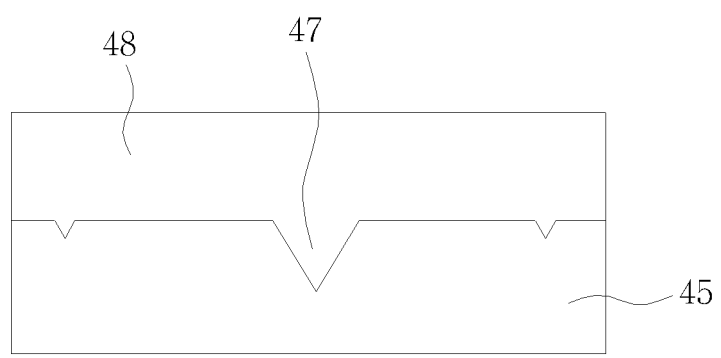
Figure 8:
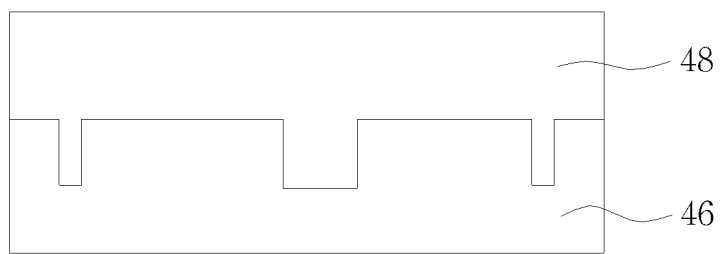

As shown in FIG. 8, an embossing pattern is formed through UV imprint using a UV resist 47 and a PMMA sheet 48 in order to make an engraving PDMS mold.

Figure 9:
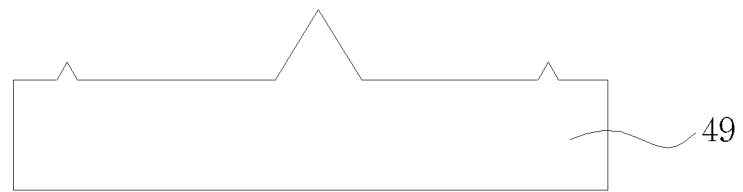
Figure 9:
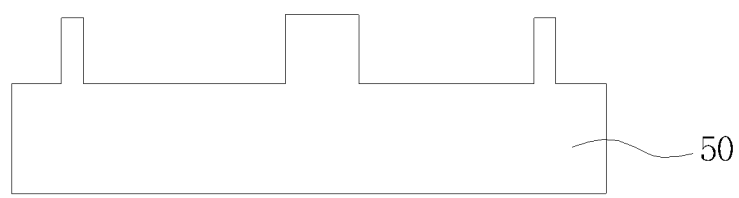

Subsequently, as shown in FIG. 9, only the groove pattern is left in the formed pattern, using the key patterns for dicing. In FIG. 9, reference numeral 49 represents a pattern layer having a V groove pattern formed therein, and reference numeral 50 represents a pattern layer having a quadrangular pattern formed therein.

A process of making an engraving PDMS mold through alignment of the PLC groove patterns formed as described above will be described as follows.

Figure 10:
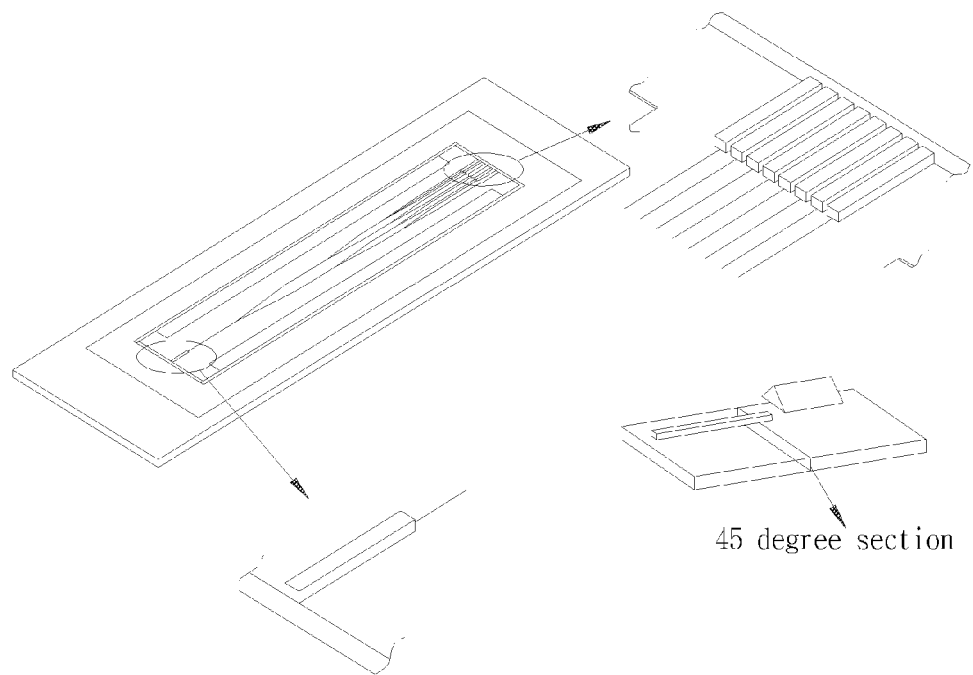
FIG. 10 is a schematic view illustrating a process of replicating a polydimethylsiloxane (PDMS) unit device mold in which PLC and groove patterns are integrated through alignment of a PLC unit device pattern and the groove pattern.

FIG. 10 is a schematic view illustrating a process of replicating a PDMS unit device mold in which PLC and groove patterns are integrated through alignment of a PLC unit device pattern and the groove pattern.

First, 45 degree polishing is performed on diced PLC device and the groove pattern in order to facilitate their alignment.

Subsequently, the PLC device and the groove pattern are integrally aligned as shown in FIG. 10. The engraving PDMS mold in which the PLC pattern and the groove pattern are integrated through a replica molding technique is made using the aligned pattern.

In this case, bubbles are removed under a vacuum atmosphere for the purpose of precise replication, and a PDMS pattern engraved with a PLC pattern is formed by removing even entrapped voids using ultrasonic vibration energy and then curing the pattern at a temperature of 60° C. for about 3 hours.

Here, the thickness of the replicated PDMS is less than 1 cm.

A process of replicating a large area PDMS pattern through repetitive replication of a unit device pattern in which a V groove with improved surface roughness and a PLC pattern are integrated will be described as follows.

Figure 11:
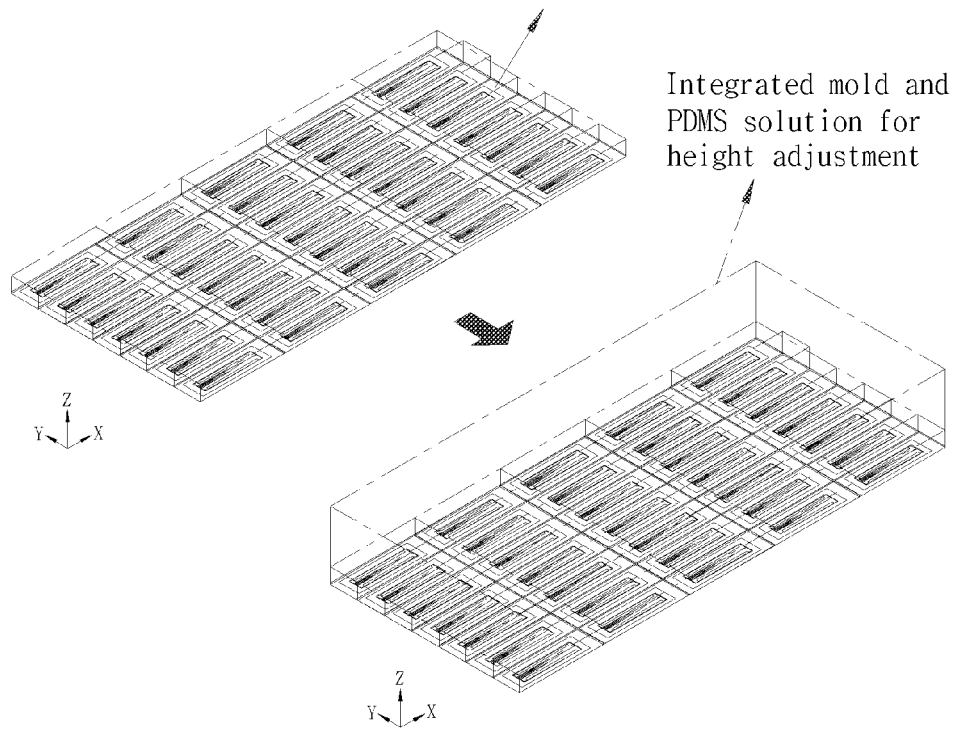
FIG. 11 is a schematic view illustrating a process of making a large area PDMS mold through the alignment according to the present invention.

FIG. 11 is a schematic view illustrating a process of making a large area PDMS mold through the alignment according to the present invention.

A unit device PDMS PLC pattern is replicated as large as a desired large area stamp, and the replicated PDMS patterns are then cut using the guide key patterns.

In this case, each PDMS pattern is placed on a glass plate having the same size as the desired large area stamp or a substrate having a clean surface. Since the replicated unit devices have different heights, liquid PDMS is poured on the cured PDMS, and thermal curing is performed on the PDMS under the same curing condition as that in curing the unit device in order to maintain a uniform height of the large area stamp and to form the unit patterns into one mold form.

The size and shape of each unit device PLC pattern used herein can be variously modified. Since the PDMS has an excellent adhesive property with the glass substrate or another substrate, there occurs no problem in that the liquid PDMS is infiltrated between the patterns.

A process of manufacturing a large area Ni stamp through electroforming, using the manufactured large area PDMS, will be described as follows.

Figure 12:
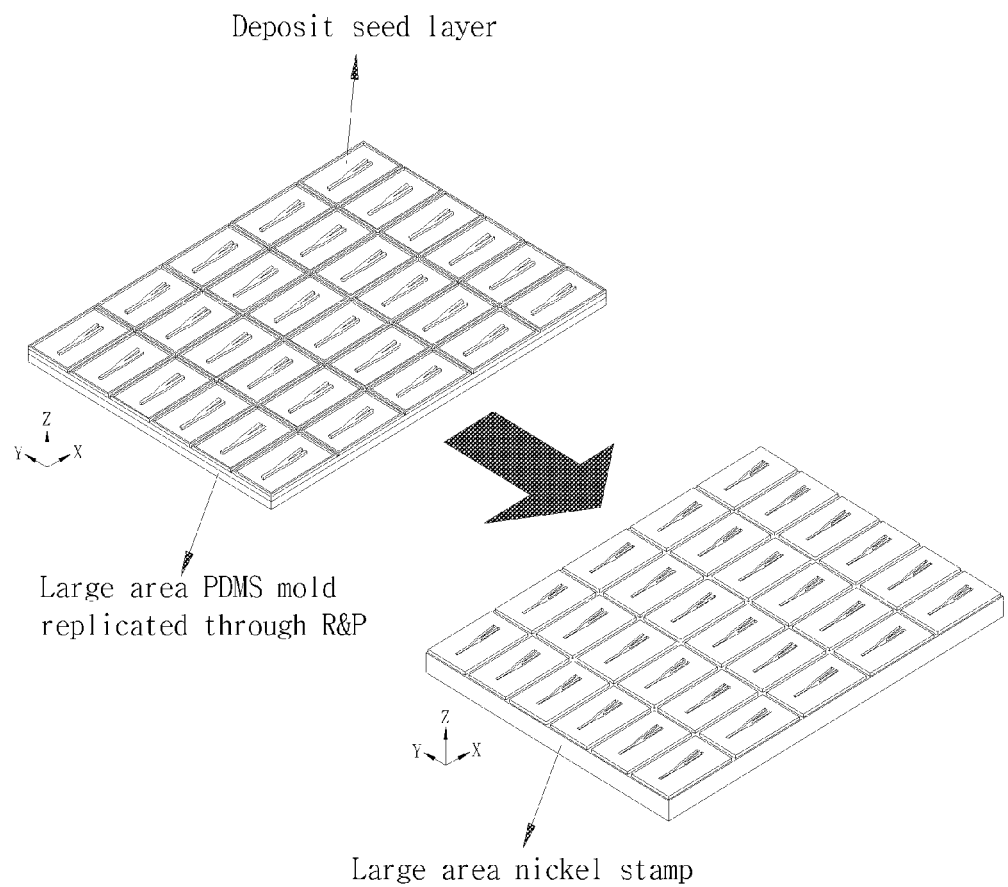
FIG. 12 is a configuration view schematically illustrating a process of manufacturing a large area Ni stamp according to the present invention.

FIG. 12 is a configuration view schematically illustrating a process of manufacturing a large area Ni stamp according to the present invention.

A Ni mold is made by depositing a base layer on a master pattern of the manufactured large area PDMS and performing electrolysis plating.

Here, cracks and exfoliation from the substrate occur due to thermal expansion caused by a difference in surface temperature between metals deposited on the base layer. Thus, it is possible to control cracks and exfoliation by depositing the base layer to 0.8±0.2 Å/sec at a temperature of 90±10° C. After the base layer is deposited, the large area Ni mold is made through Ni electrolysis plating.

A process of manufacturing a PLC pattern and a groove pattern through an R&P imprint technique using the large area Ni stamp manufactured as described above will be described as follows.

Figure 13:
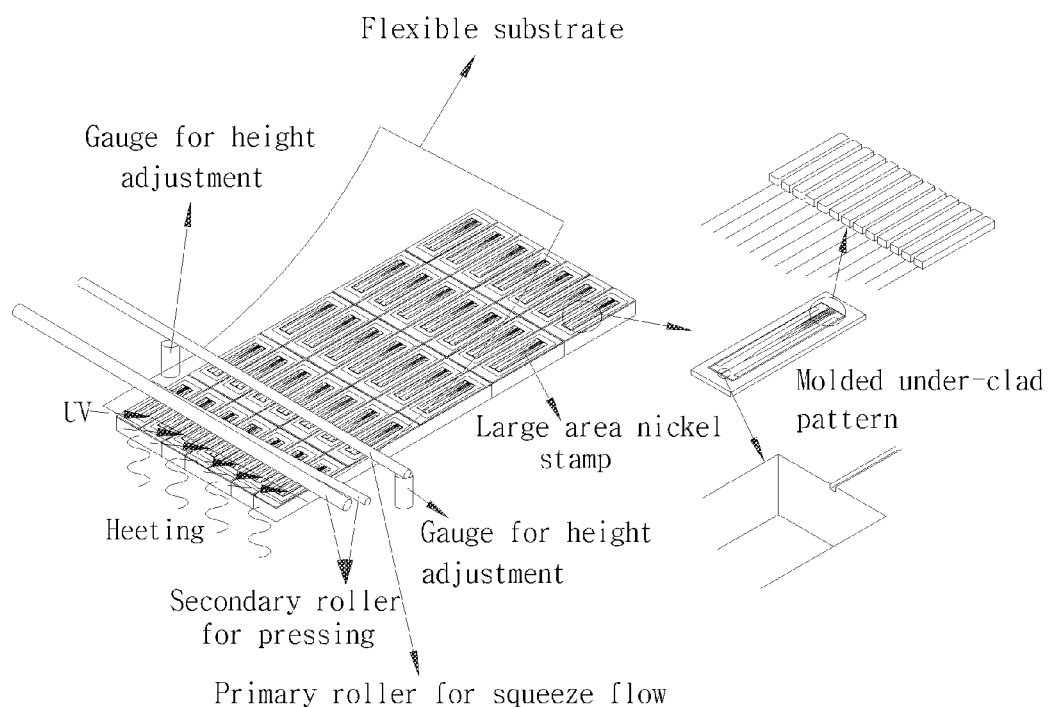
FIG. 13 is a configuration view illustrating a process of forming a core pattern using the large area Ni stamp.

FIG. 13 is a configuration view illustrating a process of forming a core pattern using the large area Ni stamp.

First, UV curable resin used as a clad material of the PLC device is dropped in a pico-level amount at a regular interval on the large area Ni stamp, and the temperature of a substrate having a heating coil built therein is maintained to be about 60° C.

This increases flowability through a decrease in viscosity of the UV curable resin.

When the large area pattern is molded, the thickness of the pattern in the entire area can be equalized, and the molding pressure of the pattern can be maintained low. Subsequently, after the height of a primary roller is adjusted, the resin is planarized and filled. Thereafter, the pattern of a channel is precisely filled with the resin by inducing squeeze flow through secondary rollers for pressing.

In UV molding the PLC device in which a gap of micron or less exists, the shape of the PLC device is damaged or deformed due to sticking in a demolding process.

Accordingly, in the present invention, the filled resin is molded through two exposure processes of soft exposure and hard exposure.

The soft exposure is first performed for 40 seconds so as to reduce interlocking on an interface and to maintain the shape of the pattern, and the hard exposure for complete curing after the demolding process is then performed under a nitrogen atmosphere for two minutes. Thus, it is possible to very precisely form the under-clad pattern and the groove pattern without any defect through these processes.

A process of forming a core and a process of manufacturing a PLC device will be described in detail as follows.

Figure 14:
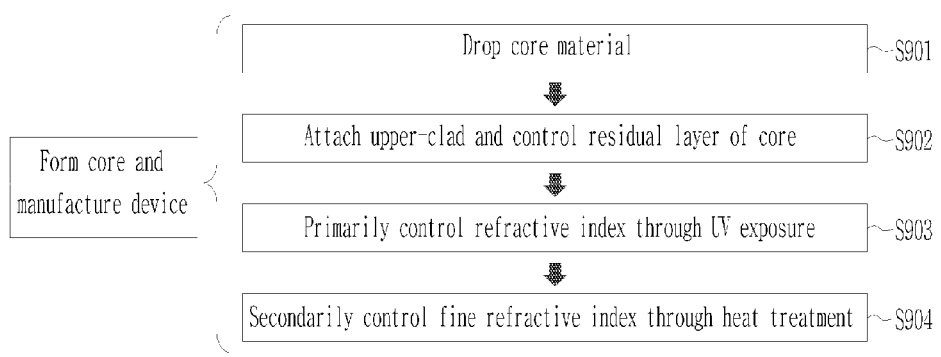
FIG. 14 is a flowchart illustrating a process of forming a core and a process of a PLC device according to the present invention.

FIG. 14 is a flowchart illustrating a process of forming a core and a process of a PLC device according to the present invention.

First, a core material is dropped on the formed PLC pattern in a pico-level amount where the core material can be filled in only the channel at a regular interval in order to fill the formed under-clad pattern with a core (S901).

Then, the core material is heated to a temperature of 60° C. so as to increase flowability. A sheet made of an upper-clad material is covered while being pressed through the two secondary rollers. Here, the portion pressed by the rollers is first contacted, and the movement is pushed outward, thereby performing the filling with the core material. Thus, it is possible to primarily adjust the thickness of a residual layer of the core. Subsequently, the thickness of the core material and the uniformity of the thickness are controlled according to the number of times of pressing, using the rollers (S902).

Subsequently, the upper-clad and the under-clad are attached to each other while curing the core through UV exposure. The refractive index of the core is primarily controlled by the amount of the UV exposure (S903).

The secondary refractive index of a device subsequently manufactured using the characteristic in which the refractive index of the UV curable resin for the core is minutely lowered during heat treatment can be precisely controlled through heat treatment (70° C.) (S904).

As described above, in the method for manufacturing the photoaligning integrated large area metallic stamp and the method for manufacturing the polymer optical device according to the present invention, it is possible to manufacture a large area stamp in which a groove pattern for supporting an optical fiber and a PLC pattern are integrated.

Further, loss in light generated in the PLC device is minimized by forming an integrated pattern including a groove for automatic alignment with the optical fiber and improving the surface roughness of the pattern, so that it is possible to manufacture a high-efficiency PLC device.

Further, several different engraving shapes of the PLC device are formed in one large area stamp, so that it is possible to provide PLC devices having various shapes through the imprint process.

Further, it is possible to manufacture a large area PLC device without pattern deformation and damage and to control the refractive index and slab thickness of the PLC device through the UV R&P imprint technique using the large area Ni stamp.

As described above, it should be understood by those skilled in the art that various modifications and changes can be made without departing from substantial features of the invention.

Therefore, the disclosed embodiments should be considered in the aspect of illustration rather than restriction. It should be understood that the scope of the invention appears in claims rather than in the foregoing specification, and equivalents of the claims are included in the invention.

Industrial Applicability

According to the present invention, it is possible to manufacture a large area PLC device without pattern deformation and damage and to control the refractive index and slab thickness of the PLC device through the UV R&P imprint technique using the large area nickel stamp. Thus, the present invention can be implemented at a low cost in data transmission required in optical communication. Further, the present invention can be applied to the development of a low-loss, large area polymer PLC device.

The invention claimed is:

1. A method for manufacturing a metallic stamp for manufacturing a polymer optical device, the method comprising:
   a) engraving a unit device planar lightwave circuit (PLC) mold pattern on a first silicon substrate through electron beam lithography and an etching process;
   b) embossing a unit PLC device pattern on a first poly methyl methacrylate (PMMA) sheet using the PLC mold pattern by a thermal imprint process;
   c) performing an annealing to the unit PLC device pattern imprinted on the first PMMA sheet;
   d) forming a first groove pattern, which is an embossed pattern, for supporting an optical fiber, using a second poly methyl methacrylate (PMMA) sheet;
   e) aligning the first groove pattern and the unit device pattern;
   f) making an integrated polydimethylsiloxane (PDMS) mold for a unit device using the aligned unit PLC device pattern and first groove pattern, the integrated PDMS mold having an engraved pattern which corresponds to the aligned unit PLC device pattern and first groove pattern; and
   g) producing a plurality of integrated PDMS molds by repeating the steps of a) through g);
   h) forming a PDMS pattern using the plurality of integrated PDMS molds, the PDMS pattern having a pattern corresponding to the plurality of integrated PDMS molds; and
   i) making the metallic stamp through electroforming using the PDMS pattern,
   wherein the step of forming the PDMS pattern comprises:
      preparing the plurality of integrated PDMS molds as large as a size of the metallic stamp and then cutting the plurality of integrated PDMS molds using a guide pattern;
      placing the plurality of integrated PDMS molds having different heights on a glass plate or substrate having the same size as the metallic stamp;

pouring liquid PDMS on the plurality of integrated PDMS molds placed on the glass plate or substrate; and thermal curing the poured PDMS under the same curing condition as a curing condition of the integrated PDMS mold for the unit device.

2. The method according to claim 1, wherein the metallic stamp is implemented in a state in which the unit PLC device pattern and the first groove pattern for supporting the optical fiber are integrated.

3. The method according to claim 1, wherein the step of embossing the unit PLC device pattern comprises:

transferring an embossing pattern on the first PMMA sheet through the thermal imprint process based on guide pins included in the first silicon substrate having the unit device PLC mold pattern formed therein.

4. The method according to claim 3, wherein the guide pins formed in the first silicon substrate are positioned at ends of input and output of a unit PLC device, and wherein the first silicon substrate includes a first guide key pattern for basic alignment of the metallic stamp of a post-process, a second key pattern for precise dicing of unit devices manufactured through the metallic stamp, and third guide key patterns for alignment of the unit PLC device pattern and the first groove pattern.

5. The method according to claim 3, wherein the thermal imprint process includes:

after heating the first PMMA sheet at a temperature greater than a glass transition temperature (Tg), applying a holing pressure greater than an initial pressure to the first PMMA sheet after the initial pressure, and applying the initial pressure again applied to the first PMMA sheet.

6. The method according to claim 1, wherein the step of the performing the annealing to the unit PLC device pattern is performed at a glass transition temperature or less (sub-Tg).

7. The method according to claim 1, wherein the step of forming the first groove pattern comprises:

coating a second silicon substrate with imprint resin to have a thickness smaller than a height of the first groove pattern to form a resist;

imprinting a quadrangular pattern on the resist at a time using a stamp for the unit device, the quadrangular pattern having the same line width as the unit PLC device pattern and the first groove pattern;

forming on the second silicon substrate a V-shaped groove pattern through anisotropic wet etching using the resist or a quadrangular groove pattern through a reactive ion etching (RIE) technique using the resist;

forming an embossing pattern corresponding to the V-shaped groove pattern or the quadrangular groove pattern through UV imprint using the second silicon substrate, a UV resist, and the second PMMA sheet; and leaving only the first groove pattern in the formed embossing pattern using a key pattern for dicing.

8. The method according to claim 7, wherein the first groove pattern is disposed on the same line as the input/output of a unit PLC device.

9. The method according to claim 1, wherein the step of making the integrated PDMS mold for the unit device comprises:

performing 45 degree polishing to the unit PLC device pattern and the first groove pattern; and integrally aligning the unit PLC device pattern and the first groove pattern, and making an engraving PDMS mold having the unit PLC device pattern and the first groove pattern integrated through a replica molding process.

10. The method according to claim 9, wherein in the replica molding process, bubbles are removed under a vacuum atmosphere, and the engraving PDMS pattern having the unit PLC pattern engraved therein is formed by removing even entrapped voids using ultrasonic vibration energy and then curing the engraving PDMS pattern at a temperature of 60° C. for approximately 3 hours.

11. The method according to claim 1, wherein the step of manufacturing the metallic stamp comprises:

depositing a base layer on the PDMS pattern; and forming a nickel mold through nickel electrolysis plating, and wherein a deposition temperature and a deposition rate of the base layer are controlled to prevent cracks and exfoliation from a substrate due to thermal expansion caused by a difference in surface temperature between metals deposited in the deposition of the base layer.

12. The method according to claim 11, wherein in the control of the deposition temperature and the deposition rate, the base layer is deposited at a temperature of 90±10° C. at a deposition rate of 0.8±0.2 Å/sec.

* * * * *